US005376901A

United States Patent [19]

Chan et al.

[11] Patent Number: 5,376,901

[45] Date of Patent: Dec. 27, 1994

[54] HERMETICALLY SEALED MILLIMETER WAVEGUIDE LAUNCH TRANSITION FEEDTHROUGH

[75] Inventors: Steven S. Chan, Alhambra; Victor J. Watson, Rancho Palos Verdes; Cheng C. Yang; Stuart Kam, both of Torrance, all of Calif.

[73] Assignee: TRW Inc., Redondo Beach, Calif.

[21] Appl. No.: 69,063

[22] Filed: May 28, 1993

[51] Int. Cl.$^5$ .................... H03H 7/38

[52] U.S. Cl. .................... 333/33; 333/248

[58] Field of Search .................... 333/26, 33, 248

[56] References Cited

U.S. PATENT DOCUMENTS 4,453,142 6/1984 Murphy .
4,463,324 7/1984 Rolfs .................... 333/26
4,550,296 10/1985 Ehrlinger et al. .
4,590,446 5/1986 Hsu et al. .................... 333/125
4,686,494 8/1987 Kaneko et al. .................... 333/137
4,740,764 4/1988 Gerlack .................... 333/26
4,901,041 2/1990 Pengelly .
4,933,745 6/1990 O'Shea et al. .
4,953,001 8/1990 Kaiser, Jr. et al. .
4,999,592 3/1991 Kanda et al. .
5,045,820 9/1991 Leicht et al. .

FOREIGN PATENT DOCUMENTS 0054404 3/1982 Japan .
0086901 5/1984 Japan .
0210804 9/1991 Japan .

*Primary Examiner*—Robert J. Pascal
*Assistant Examiner*—Darius Gambino

[57] ABSTRACT

A hermetically sealable millimeter waveguide launch transition feedthrough for channelling high frequency electrical signals in a circuit which includes at least one waveguide. An aperture is formed in one wall of the waveguide and a conductive pin passes through the aperture. The pin is sealed therein by a dielectric material which surrounds the pin so as to isolate it from the waveguide wall. A probe head is disposed at one end of the conductive pin and within the waveguide. The opposite end of the pin contains a second probe head or other circuit connector. The transition may be effectively implemented in waveguide-to-waveguide or waveguide-to-device applications as well as in colinear device housing applications.

16 Claims, 2 Drawing Sheets

HERMETICALLY SEALED MILLIMETER WAVEGUIDE LAUNCH TRANSITION FEEDTHROUGH

BACKGROUND OF THE INVENTION

1. Technical Field

This invention relates generally to millimeter wave electronic devices and, more particularly, to a hermetically sealable millimeter waveguide transition for channelling high frequency signals through a waveguide wall.

2. Discussion

The demand for Gallium Arsenide (GaAs) Monolithic Microwave Integrated Circuit (MMIC) devices is expected to drastically increase during the next few decades. This technology is capable of ever increasing operating frequencies and is frequently utilized in radars, electronic warfare, missiles and array weapons as well as a wide variety of non-military applications. As the monolithic circuitry in these devices becomes increasingly dense, and as operating frequencies increase to W-band (94 GHz) and beyond of the millimeter wave range, signal capture loss becomes a progressively more severe problem. This places a heavy burden on existing millimeter wave packaging technology, and especially on radio frequency (RF) input/output transitions, often the source of this loss.

Transitions for channelling high frequency signals from one waveguide to another formed by mechanically joining the waveguides together are typically bulky and incapable of operating at very high frequencies. Teflon® (tetrafluoroethylene or (TFE) pin feedthroughs sometimes used as a transition to interconnect two waveguides solve the space problem but have a number of inherent weaknesses. Many are found to have electrical mismatching, discontinuity problems, high RF losses and the ability only to operate below 30 GHz in frequency. This type of conventional RF transition arrangement also has a limited scope of usage because it is generally non-hermetic and unable to withstand elevated temperatures of 125° C. and beyond, often required in high RF device packaging and a must for space flight applications.

Millimeter wave housing packages, in which a GaAs MMIC chip or other high frequency electronic device is to be sealed for communication with a waveguide, without built-in hermeticity may require waveguide sealing windows used to hermetically seal off open ends of the waveguides. This, however, requires incoming and/or outgoing RF signals to pass through the sealed waveguide window, thereby creating signal distortion and loss. Additionally, extensive waveguide window development and reliability testing of the resulting package is often necessary, thereby leading to higher overall costs for these types of millimeter wave housings.

Current waveguide-to-device transition designs for millimeter wave housing packages which have addressed hermeticity generally have not been applicable to colinear applications in which the incoming and outgoing waveguide channels are disposed along a common linear axis orthogonal to the RF transition feedthrough. With non-colinear transition designs, 90 degree adapters are necessary and must be fabricated, thereby creating taller fixture housings and increasing material and machining costs. Increased volume and weight of the resulting housings makes their use undesirable for typical colinear system applications wherein size and weight are restricted.

There is therefore a need for a compact and hermetically sealable millimeter wave transition capable of operating in elevated temperatures and having low loss in the 30 GHz to 150 GHz frequency range. It would also be advantageous for this transition to be useful in providing an inexpensive low-profile colinear millimeter wave package with built-in hermeticity, useful in a variety of military and commercial applications from smart weapons to spaceborn RF payloads.

SUMMARY OF THE INVENTION

The present invention provides a signal transition feedthrough for channelling high frequency electrical signals in a circuit which includes at least one waveguide. An aperture is formed in one wall of the waveguide and a conductive pin passes through the aperture. The pin is sealed therein by a dielectric material which completely surrounds the pin so as to isolate it from the waveguide wall. A conductive probe head is attached to one end of the pin and is disposed within the waveguide. The opposite end of the pin contains a second probe head or is otherwise connected to another circuit element, depending upon the application in which the transition is to be implemented.

The transition of the present invention may be used in a variety of waveguide-to-waveguide or waveguide-to-device applications and may be effectively applied to colinear applications. Additional objects, advantages, and features of the present invention will become apparent from the following description and appended claims, taken in conjunction with the accompanying drawings.

DETAILED DESCRIPTION OF THE PREFERRED EMBODIMENTS

Figure 1:
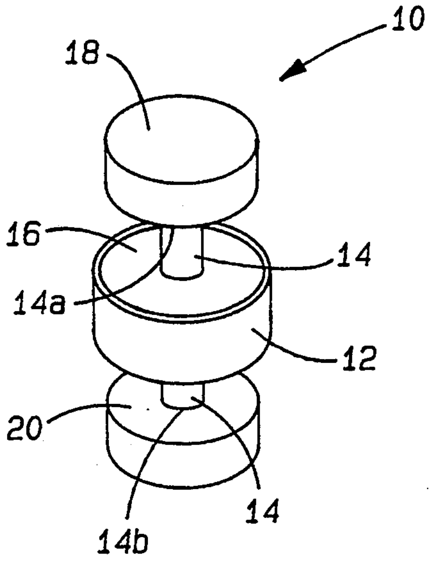
FIG. 1 is a perspective view of a preferred embodiment of the millimeter waveguide launch transition feedthrough of the present invention.

Referring generally to FIG. 1, an integrated millimeter waveguide and launch transition feedthrough (MWLTFT) according to the teachings of the present invention is indicated generally at 10. Transition feedthrough 10 includes a generally cylindrical conductive collar or ring 12 through which passes an elongated solid cylindrical conductive pin 14. Ring 12 and pin 14 are preferably concentric to within a close tolerance and may be formed of any suitable conductive material or metal but are preferably made of Kovar®, a trade name for an alloy of iron, cobalt and nickel, or any of a similar group of alloys which have an expansivity similar to that of glass.

Conductive pin 14, intermediate a first end **14*a* and a second end 14*b*, passes perpendicularly through a controlled-thermally matched dielectric glass seal 16** which is disposed within conductive ring 12 to substantially fill the interior space defined by ring 12 and to thereby hermetically seal pin 14 within ring 12. The glass composition used form glass seal 16, such as Corning 7070, is preferably thermally matched to that of the material of conductive pin 14 and ring 12 so as to prevent cracking of the glass, and therefore destruction of the hermetic seal, upon thermal expansion or contraction of any of the glass 16, ring 12 or pin 14.

Disposed at a first end 14*a* of pin 14 is a probe head 18. Probe head 18 is preferably a solid cylinder having a diameter larger than that of pin 14 but smaller than that of ring 12. Probe head 18 may alternately be of another suitable configuration or shape such as a bullet shape or double bullet shape. Probe head 18 may be formed separately for attachment to pin 14 by brazing, soldering or swaging or may be integrally formed therewith. Probe head 18 is preferably formed of the same conductive material as pin 14 but also may be made of any other suitable material. Probe head 18 is preferably spaced from ring 12 and glass seal 16 along pin 14. Depending upon the application in which it is to be implemented, a transition 10 may additionally include a second probe head 20, similar to probe head 18 and disposed at a second end 14*b* of pin 14.

Probe heads 18 and 20 act as antennas to receive or transmit high frequency signals to or from a waveguide channel. The dimensions of the conductive pin and the size of the probe heads are directly related to the unique frequency range of the signals to be channelled and therefore the size of the waveguide selected. Smaller sized waveguides are generally used for higher frequencies. After an initial size estimate, the precise size of the various component parts of transition 10 may be enlarged or decreased based upon test results. Based on such results, and on various theoretical design concepts and predictions commonly know to those having skill in the art, the transition proportions can be readily scaled to allow transitions to operate in the frequency range from 60 to 94 GHz, depending upon application. By further scaling the proportions, a 150 GHz frequency range is possible.

Figure 2:
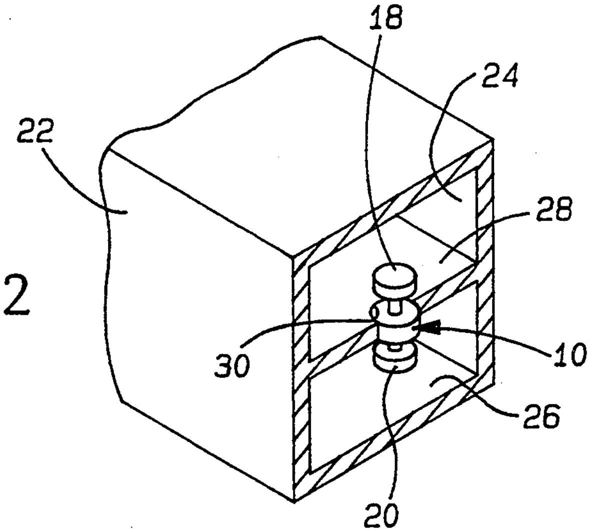
FIG. 2 is a perspective view, having a section broken away, of the present transition implemented in a waveguide-to-waveguide transition configuration.

An exemplary application of transition 10 in a waveguide-to-waveguide configuration is illustrated in the perspective view of FIG. 2. As shown in the figure, a package or housing 22 defines a pair of waveguide cavities 24 and 26, between which high frequency electrical signals are to be channelled. Housing 22 is preferably formed of a conductive metallic material but may alternately be made of any other suitable material including a nonconductive material which has been coated or plated with a conductor.

Waveguide channels 24 and 26 shown in FIG. 2 each have four surrounding walls used to contain electrical signals, with one wall of each channel 24 and 26 cooperating to define a transition wall 28 through which high frequency electrical signals are to be transmitted. Alternately, however, waveguide channels 24 and 26 may be of any other suitable cross-sectional shape. Waveguide channels 24 and 26 may be integrally formed in housing 22 or may be formed separately and joined together to define a transition wall 28.

Transition wall 28 of housing 22 preferably includes a suitably sized aperture 30 into which ring 12 of transition 10 fits and may be hermetically sealed, such as by soldering. Preferably, the width of ring 12 is substantially equal to the thickness of wall 28 along the periphery of aperture 30. Alternately, however, ring 12 may be eliminated by providing a suitable conductive inside surface of aperture 30 or ring 12 may be integrally formed therewith.

Transition 10 in the configuration of FIG. 2 includes a pair of probe heads 18 and 20 which, in this preferred embodiment, act as excited cylindrical antennas in rectangular waveguide channels 24 and 26. Probe head 18 is disposed within waveguide opening 24 and receives high frequency signals channelled therethrough. The signals pass from probe head 18 through pin 14 into probe head 20. Probe head 20 then serves to transmit signals into waveguide 26 for channelling.

Figure 3:
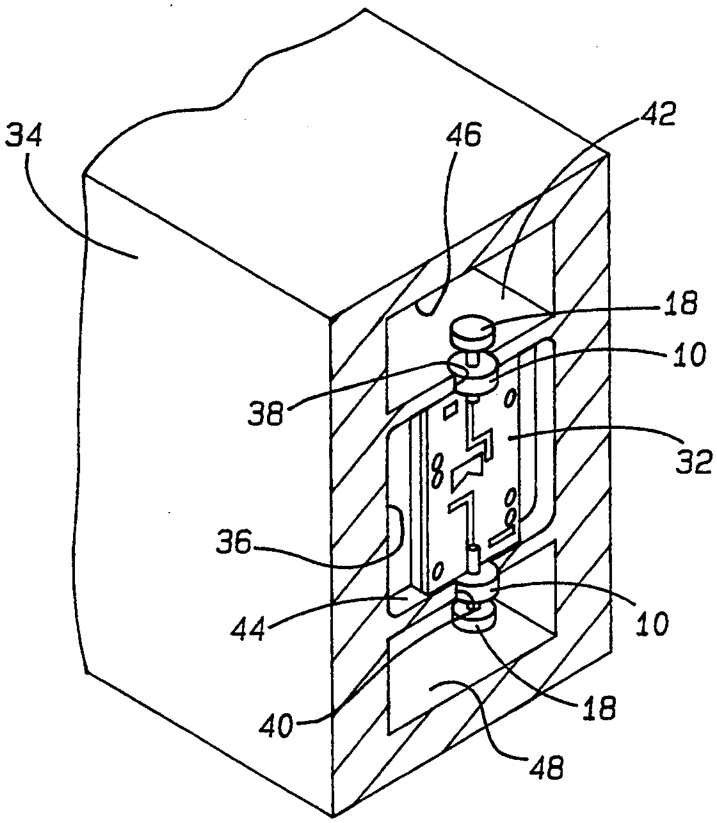
FIG. 3 is a perspective view, having a section broken away, of the present transition implemented in a waveguide-to-device-to-waveguide configuration.

Shown in FIG. 3 is an alternative implementation of the present invention in a waveguide-to-device-to-waveguide configuration. This type of application is intended to facilitate hermetic sealing of an environmentally sensitive electronic device such as a GaAs MMIC chip within a device housing 34. Housing 34 in this exemplary embodiment includes an interior cavity 36 into which a device 32 is to be sealed. Cavity 36 is preferably completely hermetically sealable, with the exception of a pair of apertures 38 and 40 which extend through transition walls 42 and 44. Housing 34 may be formed of two like portions joined together to create sealed cavity 36 or may alternately include a separately attachable cover similarly directed toward this purpose.

Adjacent cavity 36 are waveguide channels 46 and 48. Channels 46 and 48 may be integrally formed in housing 34 or may be separately formed and attached thereto. Apertures 38 and 40 extend through transition walls 42 and 44 which separate cavity 36 from waveguide channels 46 and 48. Disposed in each of apertures 38 and 40 is a ring 12 of a transition 10.

Each transition 10 has a probe head 18 at a first end 14*a* of pin 14 but not at second end 14*b*. Each transition 10 is positioned such that the probe head 18 of each is disposed in one of waveguide openings 46 and 48. The second end 14*b*, of each conductive pin 14 is electrically connected directly to electronic device 32 or to an interface or other connector, such a device interface often being a microstrip line disposed on a dielectric substrate. This connection is preferably made using a method know to those skilled in the art such as microsolder, wire or a ribbon bond.

Each transition 10 is preferably preassembled prior to placement in apertures 38 and 40 whereby probe head 18 is disposed at end 14*a* of pin 14 and wherein pin 14 has been sealed by dielectric glass 16 into ring 12. Each ring 12 is then hermetically sealed into one of apertures 38 and 40, such as by soldering or other suitable method. End 14*b* of each pin 14 may then be electrically attached to device 32, or to an interface thereof, by a suitable method such as microsolder, wire or a ribbon bond.

Figure 4:
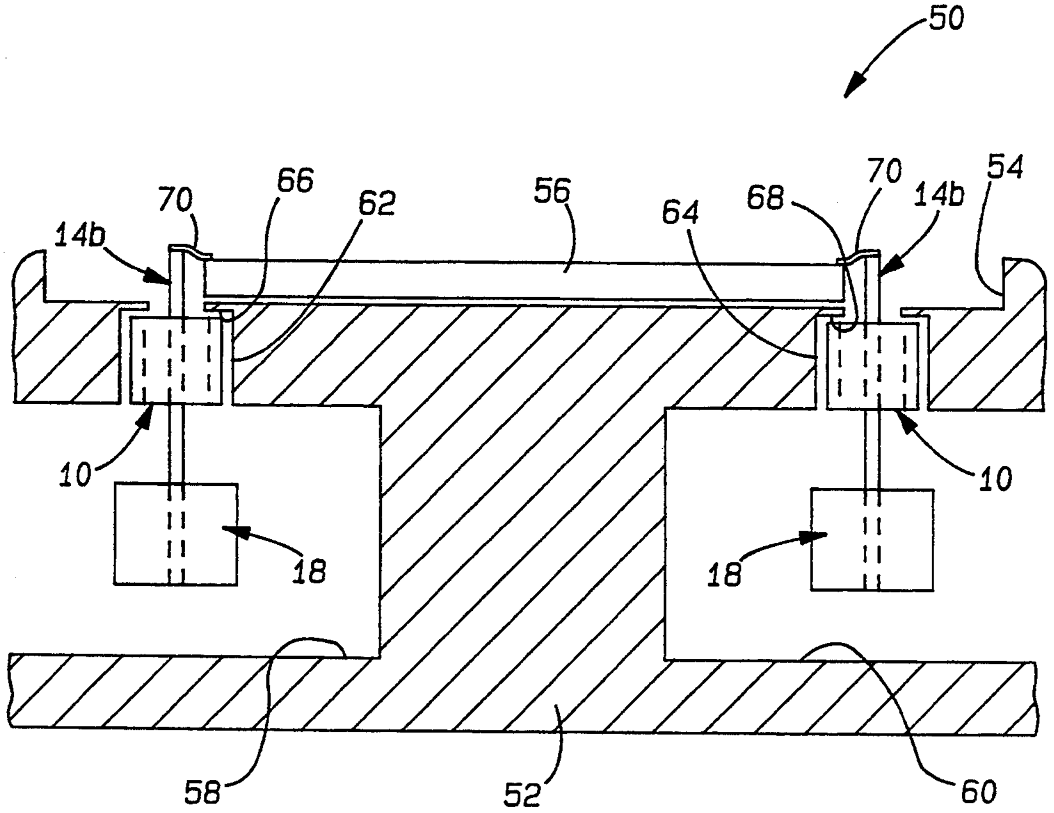
FIG. 4 is a cross sectional side view of the present invention in a colinear waveguide-to-microstrip-to-waveguide configuration.

Application of transition 10 to a low-profile and compact device housing having colinear waveguide channels is illustrated generally at 50 in FIG. 4. As shown therein, a housing 52 includes an internal cavity 54 into which a device 56 such as a low noise amplifier may be dropped. Housing 52 also has defined therein a pair of waveguide openings 58 and 60 which are disposed such that they are colinear or have a common longitudinal axis. While this common axis in the configuration shown in FIG. 4 is below device 56, it should be apparent to one having skill in the art that it could also lie above or beside device 56.

Between waveguide channels 58 and 60 and cavity 54, housing 52 further defines transition walls 62 and 64 which separate waveguide channels 58 and 60 from cavity 54. Through each of walls 62 and 64 is formed an aperture, 66 and 68, respectively, each preferably circular in cross section. Sealed within each aperture is a conductive ring 12 of a transition 10 according to the present invention. Each ring 12 is hermetically sealed into apertures 66 and 68, preferably by soldering. A conductive pin 14 is preferably already hermetically sealed in each ring 12 by a dielectric glass as discussed above. This forms an impermeable hermetic seal between waveguide channels 58 and 60 and cavity 54.

Each pin 14 has disposed at first end 14*a* a probe head 18 formed in the manner discussed above. A second end 14*b* of each pin 14 protrudes from ring 12 into cavity 54. Second ends 14*b* of each pin 14 are connected electrically to device 56, preferably by conductive ribbon bonds 70. Each transition 10 has preferably been preassembled as discussed above and then ring 12 thereof is soldered or otherwise hermetically sealed into each of apertures 38 and 40.

This configuration allows device 56 to be sealed in a compact, low-profile housing having colinear waveguide channels without requiring bulky 90° adapters. High frequency RF signals coming into waveguide channel 58 are received by probe head 18 disposed therein and passed through pin 14 and ribbon bond 70 to the device 56. After these signals are processed by device 56 they are passed in a like fashion into waveguide channel 60 as outgoing signals.

This integrated MWLTFT transition of the present invention as disclosed above provides enhanced electrical integrity at a reduced cost. The materials selected for use in the transition of the present invention allow for use in elevated temperatures as well as the ability to handle an ever increasing range of frequencies and power with a high degree of reliability. Theoretical and experimental test results on these transitions have demonstrated the ability to extend the operating frequencies from 35 to 60 to possibly 150 GHz.

Manufacturing cost reductions and system integration are made possible by a standardized transition configuration which may be preassembled for implementation into a variety of application configurations. For the high frequency millimeter package, it will allow unpackaged devices to drop into the cavities for interconnection, thus reducing cost as well as improving electrical performance. Each module may be integrated, minimizing mechanical interconnections and hardware, thereby improving system performance and greatly reducing size, volume, weight and manufacturing costs. Available low cost integrated fabrication techniques minimize electrical discontinuities and consequently reduce VSWR and transmission losses.

Implemented as an orthogonal transition as shown in FIG. 4, RF performance with an insertion loss of less than 1 dB across a measured bandwidth of 6 GHz has been achieved. The return loss was shown to be better than 15 dB, limited mainly by discontinuities between Kovar® pin 14 and the device interface substrate. An alumina substrate 0.4 inches in length was shown to have a measured insertion loss of 0.4 dB at 44 GHz, indicating a waveguide-to-microstrip transition less in this design configuration of less than 0.3 dB at 44, GHz.

It may be appreciated by one skilled in the art that the main advantage of this design, however, is its diversity and flexibility. It can be easily reproduced and scaled to a variety of waveguide sizes and frequency bands. This design is applicable to all millimeter-wave component products requiring a colinear and hermetic package for both industrial and commercial uses. This transition can be utilized in a number of military and commercial applications including low noise amplifiers, downconverters, mixers, power amplifiers, filters, test fixtures, single and multiple chip high frequency module packages and waveguide-to-microstrip transitions.

The foregoing discussion discloses and describes merely exemplary embodiments of the present invention. One skilled in the art will readily recognize from such discussion, and from the accompanying drawings, that various changes and modifications can be made therein without departing from the spirit and scope of the invention as defined in the following claims.

We claim:

1. A signal transition feedthrough for channeling high frequency electrical signals in a circuit including a waveguide, said waveguide including at least one wall having an aperture formed therein, said feedthrough comprising:

an electrically conductive pin having a first end and a second end, said pin intermediate said first and second ends passing through said aperture;

a dielectric material disposed in said aperture so as to isolate said pin from said waveguide wall;

a conductive probe head disposed within said waveguide and on said first end of said conductive pin, said probe head being spaced from said waveguide wall and said dielectric material;

a conductive collar extending between opposing openings of said aperture and located between said waveguide wall and said dielectric material to prevent direct contact between said dielectric material and said waveguide wall, said wall, collar and dielectric material cooperating to hermetically seal said conductive pin therein; and means for connecting said second end of said conductive pin to an electronic device.

2. The transition feedthrough of claim 1 wherein said dielectric material comprises glass, the thermal characteristics of said glass being matched to those of the material of said conductive pin so as to prevent cracking upon thermal expansion and contraction.

3. The transition feedthrough of claim 2 wherein said pin, collar and probe head are formed of a metal or alloy.

4. The transition feedthrough of claim 1 further comprising a second probe head disposed on said second end of said conductive pin, said transition adapted to channel said electrical signals between said probe heads.

5. The transition feedthrough of claim 1 wherein said means for connecting comprises at least one of microsolder, wire or ribbon bond.

6. The transition feedthrough of claim 1 further comprising means for connecting said second end of said conductive pin to an electronic device interface, said interface comprising a microstrip line disposed on a dielectric substrate.

7. The transition feedthrough of claim 6 wherein said substrate is disposed in a position orthogonal to said conductive pin.

8. The transition feedthrough of claim 7 wherein a conductive ribbon bond electrically connects said second end of said conductive pin to said microstrip line.

9. A hermetically sealable housing for an electronic device comprising:

a housing having an interior cavity formed therein, said device being disposed within said cavity;

a pair of waveguide channels, said channels each cooperating with said cavity to define a wall therebetween, each said wall having an aperture defined therein;

a transition feedthrough disposed within each said aperture, each said transition including a conductive pin having a first end and a second end, said pins each passing through said aperture intermediate said first and second ends, each said transition further including a conductive collar disposed in said aperture;

a dielectric material disposed in each said aperture so as to isolate said pin from said wall, said dielectric material forming a hermetic seal between said collar and said pin and wherein said conductive collar extends between opposing openings of said aperture and is located between said dielectric material and said waveguide wall to prevent direct contact therebetween:

a conductive probe head disposed on said first end of each said conductive pin, said probe heads each disposed in a different waveguide channel;

a means for electrically connecting said second ends of said conductive pins to said device.

10. The device of claim 9 wherein each said waveguide channel has a longitudinal axis, said longitudinal axes being colinear.

11. The device of claim 9 wherein said means for connecting comprises at least one of micro solder, wire or ribbon bond.

12. The device of claim 9 wherein said dielectric material comprises glass, the thermal characteristics of said glass being matched to those of the material of said conductive pin so as to prevent cracking upon thermal expansion and contraction.

13. The transition feedthrough of claim 9 wherein said pin, collar and probe head are formed a metal or alloy.

14. A method for forming a hermetically sealable electronic device housing comprising the steps of:

providing a housing having an interior cavity and a pair of waveguide channels formed therein, said housing defining a wall between said cavity and each said waveguide channel wherein each said wall defines an aperture;

disposing said device in said cavity;

providing a pair of probe transitions, each transition comprising a conductive pin having a probe head attached to one end thereof, said conductive pins each passing through a conductive collar and being hermetically sealed therein by a dielectric material, said conductive collar extending between opposing openings of each said aperture and located between said waveguide wall and said dielectric material to prevent direct contact between said dielectric material and said waveguide wall, wherein said dielectric material is glass;

positioning one said probe transition in each said wall such that said collar is disposed in said aperture and said probe head is disposed in said waveguide channel;

hermetically sealing each said conductive collar in one of said apertures and thermally matching said glass to said conductive pin and said conductive collar to prevent cracking during thermal expansion and contraction.

15. The method of claim 14 wherein each said collar is sealed in said aperture with solder.

16. The method of claim 14 wherein said second end of said pin is connected to said device using at least one of micro solder, wire or ribbon bond.

* * * * *